United States Patent
Kim

(10) Patent No.: US 10,114,693 B2
(45) Date of Patent: Oct. 30, 2018

(54) MEMORY SYSTEMS AND ELECTRONIC SYSTEMS PERFORMING AN ADAPTIVE ERROR CORRECTION OPERATION WITH PRE-CHECKED ERROR RATE, AND METHODS OF OPERATING THE MEMORY SYSTEMS

(71) Applicant: SK hynix Inc., Icheon-si Gyeonggi-do (KR)

(72) Inventor: Soojin Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/653,790

(22) Filed: Jul. 19, 2017

(65) Prior Publication Data
US 2018/0210786 A1    Jul. 26, 2018

(30) Foreign Application Priority Data
Jan. 23, 2017  (KR) ........................ 10-2017-0010731

(51) Int. Cl.
H03M 13/00    (2006.01)
G06F 11/10    (2006.01)
G06F 12/02    (2006.01)
G11C 29/52    (2006.01)
H03M 13/35    (2006.01)

(52) U.S. Cl.
CPC ...... *G06F 11/1044* (2013.01); *G06F 11/1048* (2013.01); *G06F 11/1068* (2013.01); *G06F 12/0238* (2013.01); *G11C 29/52* (2013.01); *H03M 13/353* (2013.01)

(58) Field of Classification Search
CPC ............ G06F 11/1044; G06F 11/1048; G06F 11/1068; G06F 12/0238; G11C 29/52
See application file for complete search history.

(56) References Cited

U.S. PATENT DOCUMENTS

| 8,156,398 B2 * | 4/2012 | Sommer | G06F 11/1072 714/752 |
| 8,161,354 B2 * | 4/2012 | Chen | G11C 16/349 714/6.13 |
| 8,291,295 B2 * | 10/2012 | Harari | G06F 11/1068 365/185.09 |

(Continued)

*Primary Examiner* — Esaw T Abraham
(74) *Attorney, Agent, or Firm* — William Park & Associates Ltd.

(57) ABSTRACT

A memory system may include a test vector generator configured for generating a test vector to be written into a memory device, a data discrepancy checker configured for comparing read data outputted from the memory device with the test vector to generate an information signal corresponding to a comparison between the read data and the test vector, an error correction code (ECC) controller configured for performing an ECC encoding operation and an ECC decoding operation according to any one among a plurality of ECC levels based on a control signal, and a memory controller controlling the test vector generator, the data discrepancy checker and the ECC controller. The memory controller configured to transmit the control signal corresponding to an error rate of the memory device to the ECC controller, based on the information signal generated by the data discrepancy checker.

22 Claims, 11 Drawing Sheets

(56) References Cited

U.S. PATENT DOCUMENTS

| | | | |
|---|---|---|---|
| 8,341,501 B2* | 12/2012 | Franceschini | G06F 12/0246 |
| | | | 711/103 |
| 8,464,137 B2* | 6/2013 | Franceschini | G06F 11/1012 |
| | | | 714/773 |
| 8,700,974 B2* | 4/2014 | Chung | G11C 7/1006 |
| | | | 714/763 |
| 8,713,408 B2* | 4/2014 | Lee | G06F 11/1048 |
| | | | 714/768 |
| 8,990,670 B2* | 3/2015 | Ozdemir | G06F 11/1048 |
| | | | 714/810 |
| 9,417,945 B2* | 8/2016 | Authement | G06F 11/1048 |
| 9,601,205 B2* | 3/2017 | Yoo | G11C 16/10 |
| 9,672,942 B2* | 6/2017 | Yoon | G11C 29/52 |
| 2004/0153902 A1* | 8/2004 | Machado | G06F 11/1068 |
| | | | 714/710 |
| 2016/0188405 A1 | 6/2016 | Li et al. | |

\* cited by examiner

MEMORY SYSTEMS AND ELECTRONIC SYSTEMS PERFORMING AN ADAPTIVE ERROR CORRECTION OPERATION WITH PRE-CHECKED ERROR RATE, AND METHODS OF OPERATING THE MEMORY SYSTEMS

CROSS-REFERENCE TO RELATED APPLICATION

The present application claims priority under 35 U.S.C 119(a) to Korean Application No. 10-2017-0010731, filed on Jan. 23, 2017, which is herein incorporated by references in its entirety.

BACKGROUND

1. Technical Field

Various embodiments of the present disclosure may generally relate to memory systems and methods of operating the same and, more particularly, to memory systems and electronic systems configured for performing an adaptive error correction operation with a pre-checked error rate and methods of operating the memory systems.

2. Related Art

Nonvolatile memory devices retain its stored data even when its power supplies are interrupted. Data storage units including the nonvolatile memory devices are widely used in portable systems such as smart phones, digital cameras or computers. The nonvolatile memory devices, particularly, NAND-type flash memory devices have been developed using multi-level cell (MLC) techniques and advanced process techniques to increase the integration density of the NAND-type flash memory devices. The MLC techniques have been proposed to increase the number of bits which are capable of storing data in a single cell, and the advanced process techniques have been proposed to reduce a minimum feature size of patterns constituting memory cells of semiconductor devices. Recently, three-dimensional and vertical cell structures have been developed to overcome the limitation of planar-type memory cell array structures in which memory cells are two dimensionally arrayed. Additionally, three-dimensional and vertical cell structures have been developed to more efficiently increase the integration density of the NAND-type flash memory devices.

The process techniques for forming fine patterns and the MLC techniques for increasing the number of bits in a limited area may lead to degradation of the reliability of the NAND-type flash memory devices. This is because cell-to-cell interference occurs if a pattern size is reduced and as such data errors easily occur if multi-bits are realized in a single cell using the MLC techniques. Accordingly, error correction code (ECC) schemes have been used to guarantee the reliability of the semiconductor devices which have been fabricated using the advanced process techniques and the MLC techniques.

In case of the nonvolatile memory devices, such as phase change random access memory (PCRAM) devices, magnetoresistive RAM (MRAM) devices, nano floating gate memory (NFGM) devices, resistive RAM (RRAM) devices, or polymer RAM devices, a read margin for recognizing a difference between a datum "0" and a datum "1" may be relatively narrow due to the nature of cells thereof. Thus, the nonvolatile memory devices including the PCRAM devices, the MRAM device, the NFGM devices, the RRAM devices and the polymer RAM devices may exhibit a relatively high error rate as compared with the NAND-type flash memory devices even though a single level cell (SLC) structure is employed therein. As a result, it is necessary to employ the ECC scheme in the nonvolatile memory devices including the PCRAM devices, the MRAM device, the NFGM devices, the RRAM devices and the polymer RAM devices.

SUMMARY

Various embodiments are directed to memory systems and electronic systems performing an adaptive error correction operation with a pre-checked error rate and methods of operating the memory systems.

According to an embodiment, a memory system may be provided. The memory system may include a test vector generator configured to generate a test vector to be written into a memory device. The memory system may include a data discrepancy checker configured for comparing read data outputted from the memory device with the test vector to generate an information signal corresponding to a comparison between the read data and the test vector. The memory system may include an error correction code (ECC) controller configured for performing an ECC encoding operation and an ECC decoding operation according to any one among a plurality of ECC levels based on a control signal. The memory system may include a memory controller configured for controlling the test vector generator, the data discrepancy checker and the ECC controller. The memory controller may transmit the control signal corresponding to an error rate of the memory device to the ECC controller, based on the information signal generated by the data discrepancy checker.

According to an embodiment, a memory system may be provided. The memory system may include a test vector generator configured to generate a test vector to be written into a memory device. The memory system may include a data discrepancy checker configured to compare read data outputted from the memory device with the test vector to generate an information signal corresponding to a comparison between the read data and the test vector. The memory system may include an error correction code (ECC) controller configured to perform an ECC encoding operation and an ECC decoding operation using an ECC level inputted to the ECC controller. The memory system may include a memory controller configured to control the test vector generator, the data discrepancy checker and the ECC controller. The memory controller may transmit the ECC level corresponding to an error rate of the memory device among a plurality of ECC levels to the ECC controller, based on the information signal generated by the data discrepancy checker.

According to an embodiment, a memory system may be provided. The memory system may include a test vector generator configured to generate a test vector to be written into a memory device. The memory system may include a data discrepancy checker configured to compare read data outputted from the memory device with the test vector to generate an information signal corresponding to a comparison between the read data and the test vector. The memory system may include a memory controller configured to control the test vector generator and the data discrepancy checker. The memory controller may perform an error correction code (ECC) encoding operation and an ECC decoding operation using an ECC level corresponding to an error rate of the memory device among a plurality of ECC levels, based on the information signal generated by the data discrepancy checker.

According to an embodiment, an electronic system may be provided. The electronic system may include a code memory configured for storing a firmware code. The electronic system may include a test vector generator configured to generate a test vector to be written into the code memory. The electronic system may include a data discrepancy checker configured to compare read data outputted from the code memory with the test vector to generate an information signal corresponding to a comparison between the read data and the test vector. The electronic system may include an error correction code (ECC) controller configured to perform an ECC encoding operation of firmware according to an any one of a plurality of ECC levels to generate encoded data based on a control signal. The electronic system may include a memory controller configured to transmit the control signal corresponding to an error rate of the code memory among the plurality of ECC levels to the ECC controller based on the information signal generated by the data discrepancy checker and may be configured to write the encoded data generated by the ECC controller into the code memory.

According to an embodiment, there may be provided a method of operating a memory system. The method may include writing an original test vector into a memory device. The method may include comparing read data corresponding to the original test vector written into the memory device with the original test vector. The method may include calculating an error rate of the memory device if the read data is inconsistent with the original test vector. The method may include setting an error correction code (ECC) level corresponding to the error rate of the memory device.

According to an embodiment, there may be provided a method of operating a memory system. The method may include periodically checking an access status of a memory device. The method may include writing an original test vector into a target region of the memory device if the access number of times of the target region is greater than a predetermined value. The method may include comparing read data corresponding to the original test vector written into the target region of memory device with the original test vector. The method may include calculating an error rate of the memory device if the read data is inconsistent with the original test vector. The method may include setting an error correction code (ECC) level corresponding to the error rate of the memory device.

According to an embodiment, there may be provided a method of operating a memory system. The method may include sensing a change of an error rate of a memory device to perform an error correction code (ECC) encoding operation or an ECC decoding operation using an ECC level corresponding to the changed error rate during a read operation or a write operation. A currently set ECC level may be applied to encoded data, which may be generated by applying different ECC levels to data of the memory device, to perform a data scrubbing process for achieving an ECC encoding operation.

According to an embodiment, there may be provided a memory system. The memory system may include a memory device. The memory system may include a memory controller configured to check a status of the memory device to determine if the memory device is in an initialized status so that, if in the initialized status, a control operation for setting an error correction code (ECC) level can be performed to calculate an error rate of the memory device, if received information on a data comparison according to a comparison result on a test vector and read data, corresponding to the test vector, from the memory device, indicates that the read data is inconsistent with the test vector. The memory system may include an ECC controller configured to determine a current ECC level corresponding to the error rate calculated by the memory controller to perform an ECC encoding operation and an ECC decoding operation using the current ECC level until the current ECC level is changed into another ECC level.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
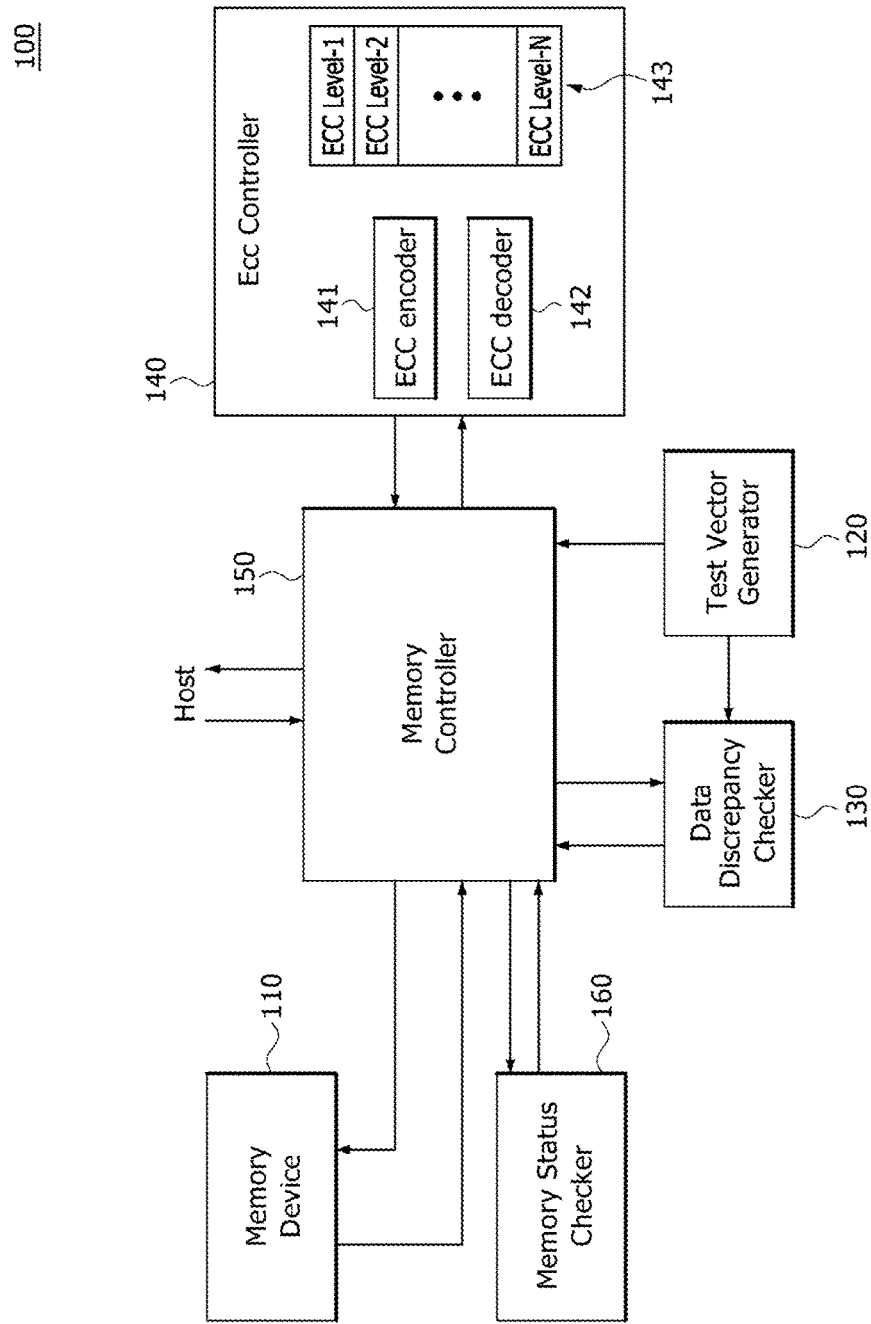
FIG. 1 is a block diagram illustrating a memory system according to an embodiment of the present disclosure.

FIG. 1 is a block diagram illustrating a memory system 100 according to an embodiment of the present disclosure. Referring to FIG. 1, the memory system 100 may include a memory device 110, a test vector generator 120, a data discrepancy checker 130, an error correction code (ECC) controller 140 and a memory controller 150. The memory system 100 may further include a memory status checker 160. In an embodiment, the memory device 110 may be a semiconductor memory device, for example, a phase change random access memory (PCRAM) device, a magnetoresistive RAM (MRAM) device, a nano floating gate memory (NFGM) device, a resistive RAM (RRAM) device or a polymer RAM device.

The test vector generator 120 may generate a test vector which is written into the memory device 110. In an embodiment, the test vector may be comprised of a binary data stream. In an embodiment, the test vector generator 120 may generate a test vector according to a request of the memory controller 150. In such a case, binary data of the test vector may be randomly generated. The test vector generated by the test vector generator 120 may be written into the memory device 110 through the memory controller 150. The test vector may be transmitted to the data discrepancy checker 130.

The data discrepancy checker 130 may compare read data outputted from the memory device 110 through the memory controller 150 with the test vector outputted from the test vector generator 120 to generate a signal corresponding to the comparison result. Accordingly, the data discrepancy checker 130 may include a comparison logic circuit. In an embodiment, the data discrepancy checker 130 may compare the read data with the test vector using a bit-to-bit comparison method, and the data discrepancy checker 130 may transmit an information signal including the comparison result to the memory controller 150.

The ECC controller 140 may include an ECC encoder 141 performing an ECC encoding operation and an ECC decoder 142 performing an ECC decoding operation. The ECC encoder 141 may perform an ECC encoding operation on data, which are outputted from a host through the memory controller 150, to generate encoded data. The encoded data may be written into the memory device 110 through the memory controller 150. The ECC decoder 142 may perform an ECC decoding operation on data, which are outputted from the memory device 110 through the memory controller 150, to generate decoded data. The decoded data may be transmitted to the host through the memory controller 150. The ECC encoding operation performed by the ECC encoder 141 and the ECC decoding operation performed by the ECC decoder 142 may be performed according to any one of a plurality of ECC levels (e.g., first to $N^{th}$ ECC levels ECC LEVEL-1, ECC LEVEL-2, . . . , and ECC LEVEL-N). That is, the ECC controller 140 may select any one of the first to $N^{th}$ ECC levels ECC LEVEL-1, ECC LEVEL-2, . . . , and ECC LEVEL-N in response to a control signal outputted from the memory controller 150 and may perform the ECC encoding operation or the ECC decoding operation according to the selected ECC level. Thus, the ECC controller 140 may further include an ECC level storage unit 143 in which the first to $N^{th}$ ECC levels ECC LEVEL-1, ECC LEVEL-2, . . . , and ECC LEVEL-N are stored. In an embodiment, the first to $N^{th}$ ECC levels ECC LEVEL-1, ECC LEVEL-2, . . . , and ECC LEVEL-N may have different abilities of error correction. For example, the first ECC level ECC LEVEL-1 may have an ability for correcting an error of a single bit, and the $N^{th}$ ECC level ECC LEVEL-N may have an ability for correcting errors of "N"-number of bits. In an embodiment, for example, N may be a number greater than zero.

The memory controller 150 may control operations of the test vector generator 120, the data discrepancy checker 130 and the ECC controller 140. The memory controller 150 may write data outputted from the host through a host interface into the memory device 110 or may transmit data outputted from the memory device 110 to the host. During a write operation, the memory controller 150 may transmit data outputted from the host to the ECC controller 140 so that the ECC controller 140 performs an ECC encoding operation of the data to generate encoded data and may receive the encoded data from the ECC controller 140 to write the encoded data into the memory device 110. During a read operation, the memory controller 150 may transmit data outputted from the memory device 110 to the ECC controller 140 so that the ECC controller 140 performs an ECC decoding operation for correcting errors of the data to generate decoded data and may receive the decoded data from the ECC controller 140 to transmit the decoded data to the host. The memory controller 150 may check and calculate an error rate of the memory device 110 to perform a control operation for setting an ECC level at an initialized step. The memory controller 150 may periodically check and calculate an error rate of the memory device 110 to perform a control operation for setting an ECC level at a non-initialized step. In addition, the memory controller 150 may perform a control operation for a data scrubbing process and may perform a control operation for changing an ECC level during the data scrubbing process.

The memory status checker 160 may receive information on a current status of the memory device 110 from the memory controller 150 and may store the information on the current status of the memory device 110 therein. The memory status checker 160 may periodically check an access status of the memory device 110 and may transmit the check result to the memory controller 150. Thus, in the event that the memory controller 150 controls the access to the memory device 110 or the initialization of the memory device 110, the memory controller 150 may transmit the information on the current status of the memory device 110 to the memory status checker 160.

Figure 2:
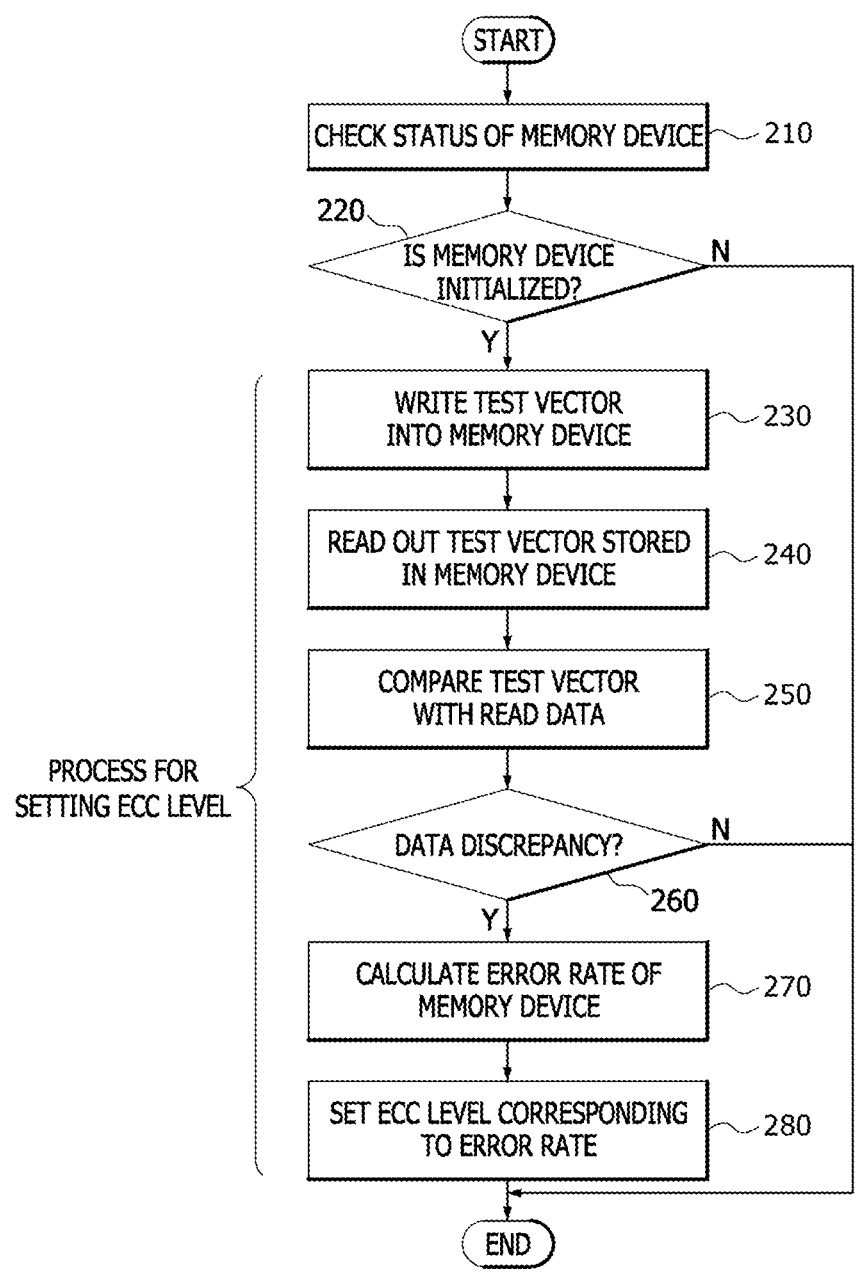
FIG. 2 is a flowchart illustrating an operation of the memory system illustrated in FIG. 1.
Figure 3:
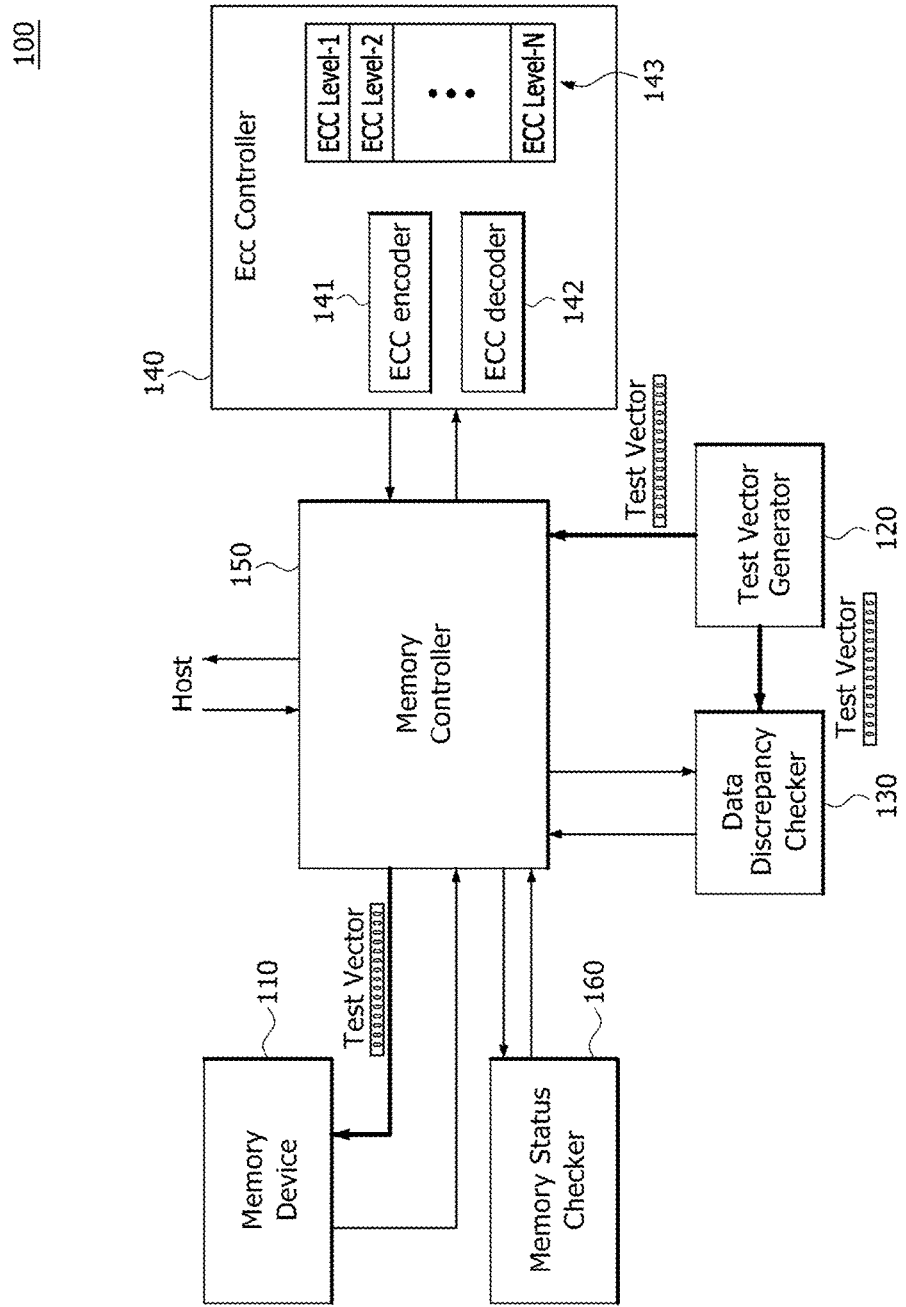
FIGS. 3 to 5 are block diagrams illustrating a process of pre-checking an error rate of the memory system illustrated in FIG. 1.
Figure 4:
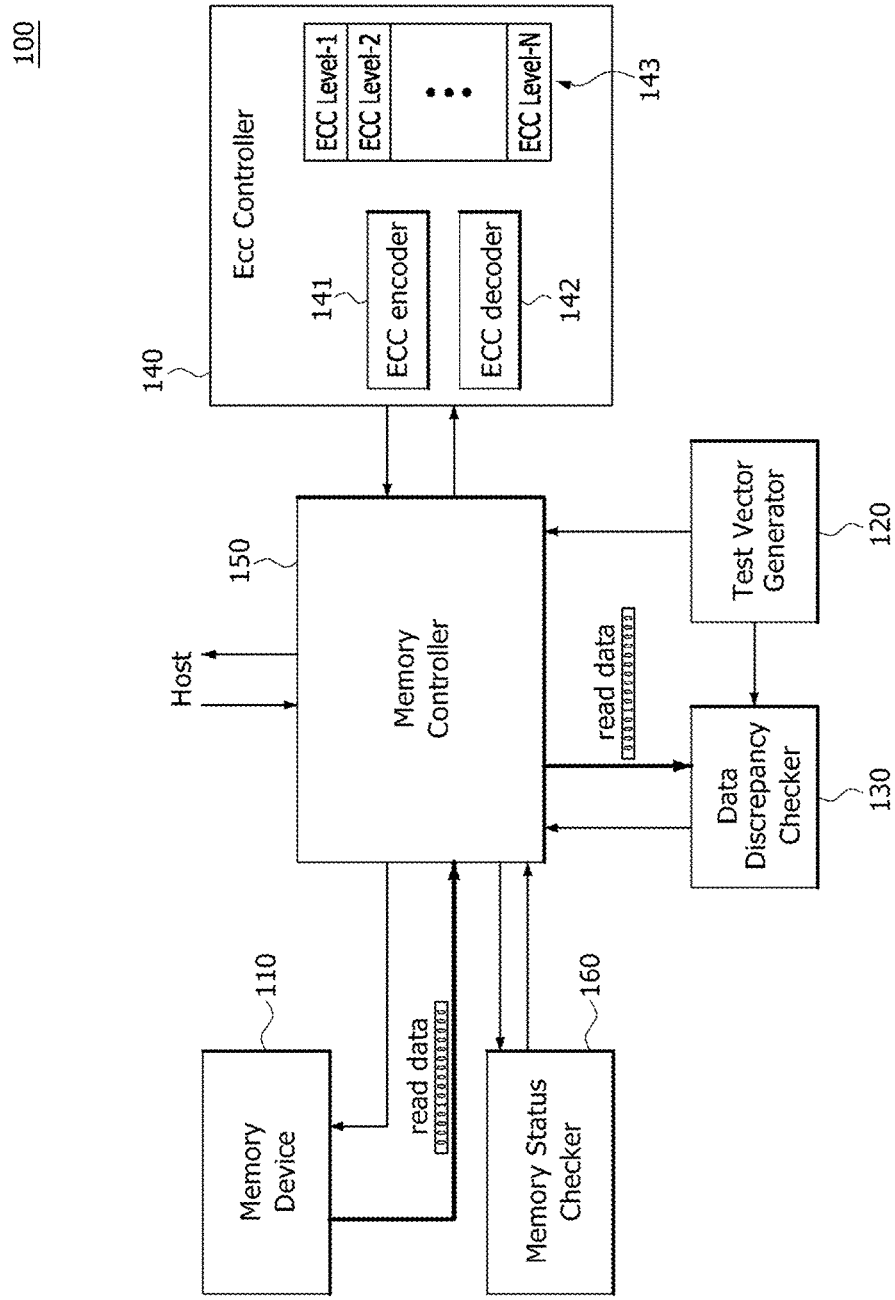
Figure 5:
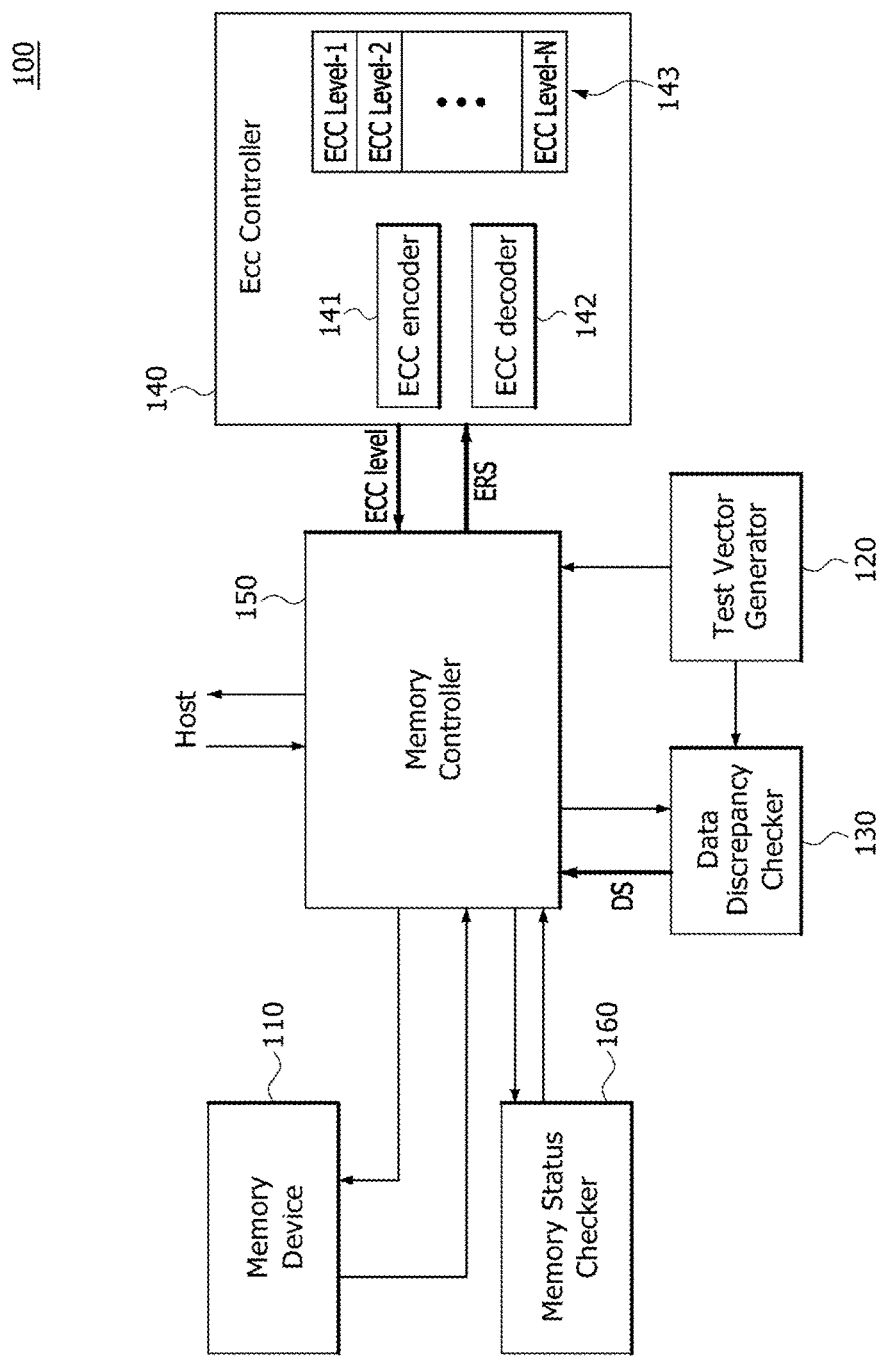

FIG. 2 is a flowchart illustrating an operation of the memory system 100 illustrated in FIG. 1, and FIGS. 3 to 5 are block diagrams illustrating a process of pre-checking an error rate of the memory system 100 illustrated in FIG. 1. In FIGS. 3 to 5, the same reference numerals as used in FIG. 1 denote the same elements. First, referring to FIGS. 2 and 3, the memory controller 150 may check a status of the memory device 110 using the memory status checker 160 (see a step 210 of FIG. 2). After checking the status of the memory device 110, the memory controller 150 may discriminate whether the memory device 110 is in an initialized status (see a step 220 of FIG. 2). If the memory device 110 is out of the initialized status, a process for setting an ECC level may not be performed (see 'N' of FIG. 2). If the memory device 110 is in the initialized status (see 'Y' of FIG. 2), the memory controller 150 may perform a control operation for setting an ECC level. The test vector generator 120 may generate a test vector in order to set an ECC level. The present embodiment will be described in conjunction with an example in which the test vector is comprised of a 16-bit binary data stream having a combination of '0000000000000000'. However, the embodiments are limited to a 16-bit binary data stream and any number of bits may be used. This test vector may be transmitted from the test vector generator 120 to the data discrepancy checker 130 and the memory controller 150. The data discrepancy checker 130 may store the test vector for a data discrepancy checking operation which is performed in a subsequent step. The memory controller 150 may receive the test vector from the test vector generator 120 and may write the test vector into the memory device 110 (see a step 230 of FIG. 2).

Next, referring to FIGS. 2 and 4, the memory controller 150 may perform an operation for reading out the test vector which is written into the memory device 110 (see a step 240 of FIG. 2). If no errors are generated while the test vector is written into the memory device 110 or while the test vector is read out of the memory device 110, read data outputted from the memory device 110 may have the same data as the test vector generated by the test vector generator 120. If an error is generated while the test vector is written into the memory device 110 or while the test vector is read out of the memory device 110, the read data outputted from the memory device 110 may be different from the test vector generated by the test vector generator 120. The present embodiment will be described in conjunction with an example in which the read data have a binary data stream of '0000100000000000', a fifth bit of which is an erroneous bit. The memory controller 150 may transmit the read data outputted from the memory device 110 to the data discrepancy checker 130.

Next, referring to FIGS. 2 and 5, the data discrepancy checker 130 may compare the read data received from the memory device 110 through the memory controller 150 with the test vector received from the test vector generator 120 (see a step 250 of FIG. 2). The data discrepancy checker 130 may also generate an information signal DS including information on data discrepancy according to the comparison result, and the information signal DS may be transmitted to the memory controller 150. Thus, the data discrepancy checker 130 may be configured to include a comparison logic circuit. In an embodiment, the information signal DS may provide information on whether the read data are identical to the test vector by each bit. For example, if the test vector is comprised of a binary data stream having a logic level combination of '0000000000000000' and the read data are comprised of a binary data stream having a logic level combination of '0000100000000000', the data discrepancy checker 130 may generate and output the information signal DS including information on that a fifth bit datum of the read data is different from a fifth bit datum of the test vector and the remaining bit data of the read data are identical to the remaining bit data of the test vector.

The memory controller 150 may discriminate whether the read data include an erroneous bit, in response to the information signal DS generated by the data discrepancy checker 130 (see a step 260 of FIG. 2). If no erroneous bit is included in the read data, a process for setting an ECC level may terminate without setting an ECC level. In such a case, the memory controller 150 may control the ECC controller 140 so that the ECC controller 140 omits an ECC encoding operation and an ECC decoding operation during a read operation and a write operation until an ECC level is set by a subsequent process for setting an ECC level.

If the information signal DS includes information on that the read data have an erroneous bit, the memory controller 150 may calculate an error rate of the memory device 110 to generate an error rate signal ERS (see a step 270 of FIG. 2). The error rate signal ERS generated by the step 270 may be transmitted to the ECC controller 140. The ECC controller 140 may determine an ECC level corresponding to the error rate signal ERS (see a step 280 of FIG. 2). The ECC controller 140 may transmit the ECC level determined by the step 280 to the memory controller 150 so that the memory controller 150 has information on a current ECC level. The ECC controller 140 may perform an ECC encoding operation and an ECC decoding operation according to the ECC level determined by the above step. In an embodiment, if the memory device 110 has an error rate denoting one erroneous bit, the ECC controller 140 may select the first ECC level ECC LEVEL-1, which is set to have ability for correcting a single bit among the first to $N^{th}$ ECC levels ECC LEVEL-1, ECC LEVEL-2, . . . , and ECC LEVEL-N, as a current ECC level. In such a case, the ECC controller 140 may perform an ECC encoding operation and an ECC decoding operation using the first ECC level ECC LEVEL-1 until the current ECC level is changed into another ECC level.

Figure 6:
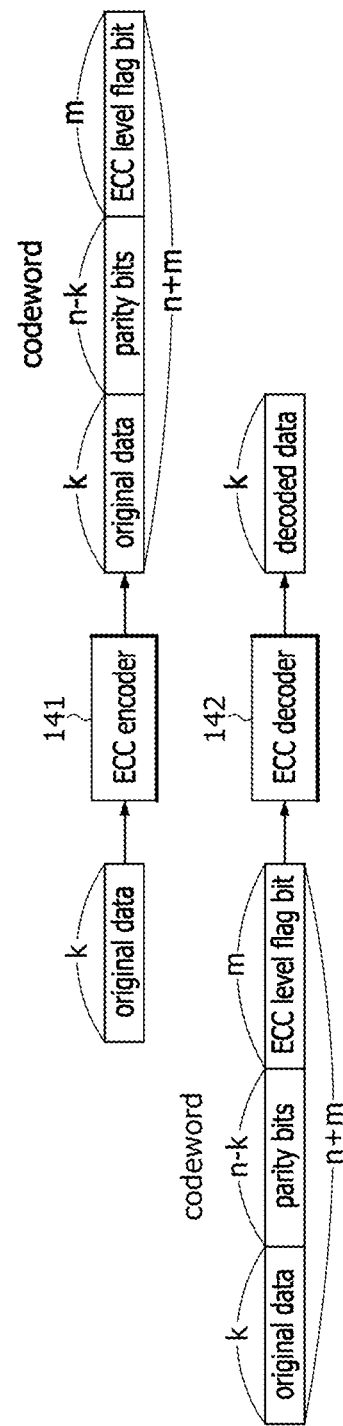
FIG. 6 is a block diagram illustrating an error correction code (ECC) encoding operation and an ECC decoding operation performed by an ECC controller included in the memory system illustrated in FIG. 1.

FIG. 6 is a block diagram illustrating an ECC encoding operation and an ECC decoding operation performed by the ECC controller 140 included in the memory system 100 illustrated in FIG.

1. Referring to FIGS. 1 and 6, "k"-bit original data inputted to the ECC controller 140 may be transmitted to the ECC encoder 141. The original data may written into the memory device 110 with a write command outputted from the host. The memory controller 150 may transmit the original data to the ECC controller 140 after checking the currently set ECC level. The original data transmitted to the ECC controller 140 may be inputted to the ECC encoder 141. The ECC encoder 141 may perform an ECC encoding operation of the original data to generate a codeword. In an embodiment, the ECC encoding operation may be performed using, for example but not limited to, a Bose-Chaudhuri-Hocquenghem (BCH) code. The codeword may be comprised of a "(n+m)"-bit binary data stream. For example, the codeword may be configured to include the "k"-bit original data, a "(n−k)"-bit parity and an "m"-bit ECC level flag. The "(n−k)"-bit parity may correspond to binary data which are added during an ECC encoding operation and may be used to correct errors during an ECC decoding operation. The "m"-bit ECC level flag may correspond to binary data that define an ECC level used during an ECC encoding operation and may be used to perform an ECC decoding operation with the same ECC level. Encoded data (i.e., the "(n+m)"-bit codeword) generated by the ECC encoder 141 may be written into the memory device 110 through the memory controller 150. In an embodiment, for example, n, k, and m may be natural numbers greater than or equal to zero.

If a read command is outputted from the host, the memory controller 150 may read out the codeword stored in the memory device 110 and may transmit the codeword to the ECC controller 140. The codeword may be inputted to the ECC decoder 142. The ECC decoder 142 may perform an ECC decoding operation of the codeword, which is read out of the memory device 110 by the memory controller 150, to generate and output "k"-bit decoded data. The "k"-bit decoded data may correspond to data that errors generated during the read operation or the write operation are corrected. Thus, the "k"-bit decoded data may be comprised of the same binary data stream as the original data. While the ECC decoding operation is performed, the ECC decoder 142 may perform an ECC decoding operation with the same ECC level as the ECC level which is applied to an ECC encoding operation using the ECC level flag of the codeword. The decoded data generated by the ECC decoder 142 may be transmitted to the host through the memory controller 150.

According to the memory system 100 described above, an error rate of the memory device 110 may be pre-checked after the memory device 110 is initialized, and an appropriate ECC level may be set according to the error rate of the memory device 110 to prevent ECC encoding operations and/or ECC decoding operations from being excessively performed regardless of errors that are substantially generated. In addition, if the error rate of the memory device 110 is zero (i.e., if no error is generated), the ECC encoding operation and the ECC decoding operation may be skipped in the ECC controller 140 to prevent the performance of the memory system 100 from being degraded due to the excessive ECC encoding operation and/or the ECC decoding operation. In general, as the frequency in use of the memory system 100 increases, the error rate of the memory device 110 may also gradually increase. According to an embodiment, the error rate of the memory device 110 may also be periodically checked to change an ECC level even at a non-initialized step. Thus, even though the error rate of the memory device 110 increases, the ECC level may be actively changed to prevent the performance of the memory system 100 from being degraded.

Figure 7:
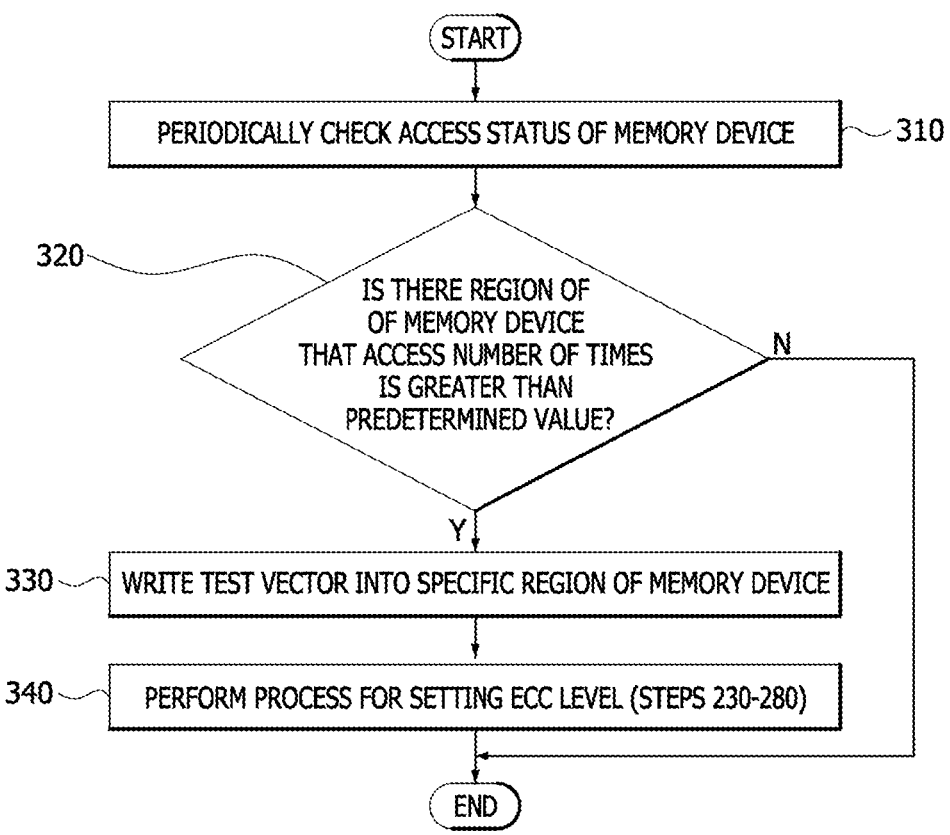
FIG. 7 is a flowchart illustrating an operation of setting an ECC level with a periodic test of an error rate of a memory device included in the memory system illustrated in FIG. 1.

FIG. 7 is a flowchart illustrating an operation of setting an ECC level with a periodic test of an error rate of the memory device 110 included in the memory system 100 illustrated in FIG. 1. Referring to FIGS. 1 and 7, the memory controller 150 may periodically check an access status to the memory device 110 using the memory status checker 160 (see a step 310 of FIG. 7). The memory controller 150 may discriminate whether a region (hereinafter, referred to as 'target region'), the access number of times of which is greater than a predetermined value, exists in the memory device 110 (see a step 320 of FIG. 2). If no target region exists in the memory device 110, the ECC controller 140 may skip performing the process for setting an ECC level and may maintain the current ECC level. If a target region exists in the memory device 110, the test vector generator 120 may generate a test vector. The test vector generated by the test vector generator 120 may be transmitted to the data discrepancy checker 130 and the memory controller 150. The data discrepancy checker 130 may store the test vector therein for a subsequent data discrepancy checking operation. The memory controller 150 may write the test vector into a specific region of the memory device 110 (see a step 330 of FIG. 2). Subsequently, the process for setting an ECC level described with reference to the steps 230-280 of FIG. 2 may be performed.

Figure 8:
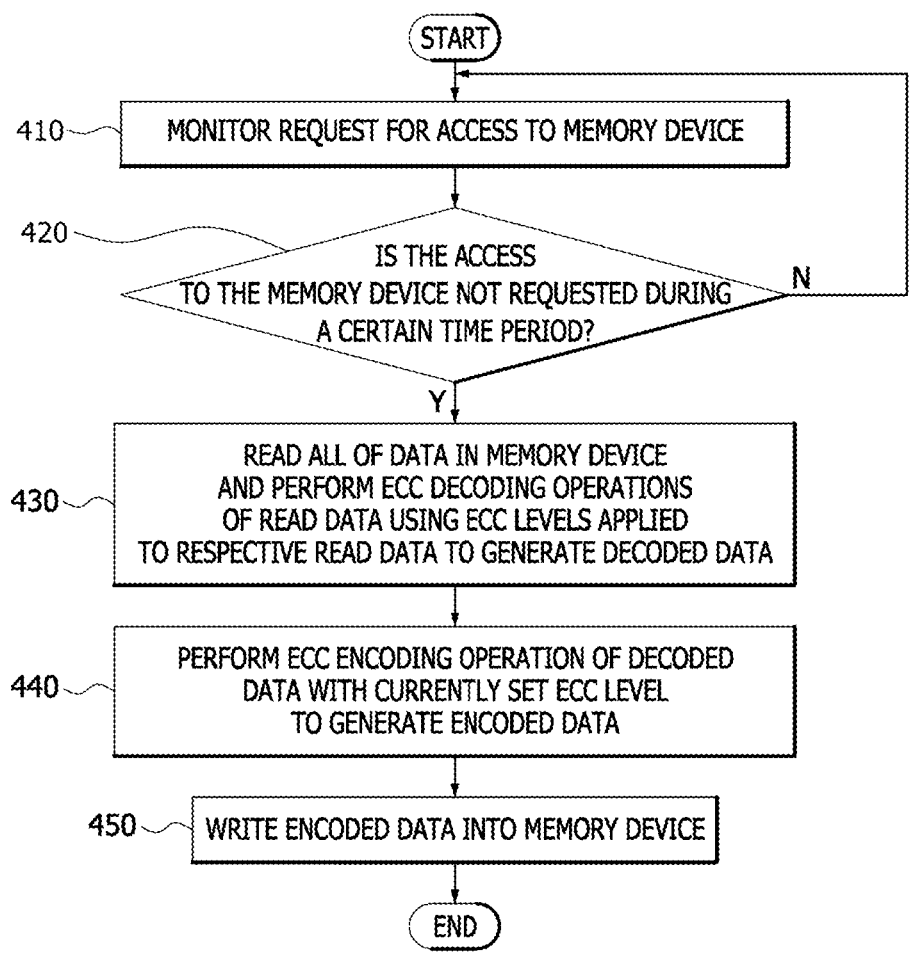
FIG. 8 is a flowchart illustrating a data scrubbing process of the memory system illustrated in FIG. 1.

FIG. 8 is a flowchart illustrating a data scrubbing process of the memory system 100 illustrated in FIG. 1. Referring to FIGS. 1 and 8, the memory controller 150 may monitor whether the access to the memory device 110 is requested (see a step 410 of FIG. 2). Subsequently, the memory controller 150 may discriminate whether the access to the memory device 110 is not requested during a certain time period (see a step 420 of FIG. 2). This discrimination may be performed by a status of a command queue storage element in the memory controller 150. If it is necessary to access to the memory device 110 during the certain time period (see 'N' for FIG. 8), the memory controller 150 may keep monitoring whether the access to the memory device 110 is requested even while the memory controller 150 performs a control operation for accessing to the memory device 110. In contrast, if it is unnecessary to access to the memory device 110 during the certain time period (see 'Y' for FIG. 8), the memory controller 150 may read out all of data in the memory device 110 and may transmit the read data outputted from the memory device 110 to the ECC controller 140. The ECC decoder 142 of the ECC controller 140 may perform an ECC decoding operation of the read data to generate decoded data and may input the decoded data into the ECC encoder 141. In such a case, the ECC decoder 142 may perform the ECC decoding operation of the read data with an ECC level which is applied to the ECC encoding operation by the ECC level flag included in the read data, as described with reference to FIG. 6 (see a step 430 of FIG. 2). The ECC encoder 141 may receive the decoded data generated by the ECC decoder 142 and may perform an ECC encoding operation of the decoded data with a currently set ECC level to generate encoded data (see a step 440 of FIG. 2). The memory controller 150 may re-write the encoded data into the memory device 110 (see a step 450 of FIG. 2). Accordingly, all of the data stored in the memory device 110 may be encoded with the currently set ECC level using the data scrubbing process illustrated in FIG. 8.

Figure 9:
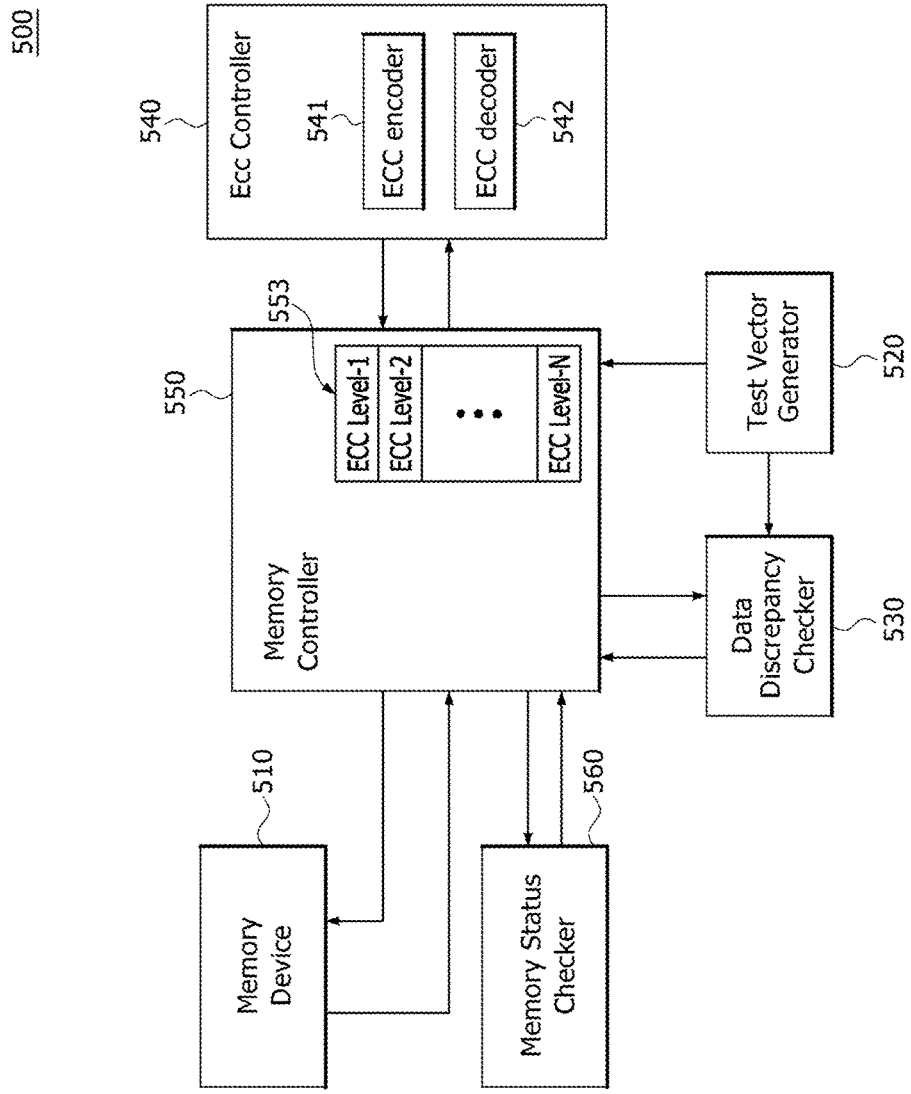
FIG. 9 is a block diagram illustrating a memory system according to an embodiment of the present disclosure.

FIG. 9 is a block diagram illustrating a memory system 500 according to an embodiment of the present disclosure. Referring to FIG. 9, the memory system 500 may include a memory device 510, a test vector generator 520, a data discrepancy checker 530, an error correction code (ECC) controller 540 and a memory controller 550. The memory system 500 may further include a memory status checker 560. In an embodiment, the memory device 510 may be a semiconductor memory device, for example, a phase change random access memory (PCRAM) device, a magnetoresistive RAM (MRAM) device, a nano floating gate memory (NFGM) device, a resistive RAM (RRAM) device or a polymer RAM device.

The test vector generator 520 may generate a test vector which is written into the memory device 510. In an embodiment, the test vector may be comprised of a binary data stream. In an embodiment, the test vector generator 520 may generate a test vector according to a request of the memory controller 550. In such a case, binary data of the test vector may be randomly generated. The test vector generated by the test vector generator 520 may be written into the memory device 510 through the memory controller 550. In addition, the test vector may be transmitted to the data discrepancy checker 530.

The data discrepancy checker 530 may compare read data outputted from the memory device 510 through the memory controller 550 with the test vector outputted from the test vector generator 520 to generate a signal corresponding to the comparison result. Accordingly, the data discrepancy checker 530 may include a comparison logic circuit. In an embodiment, the data discrepancy checker 530 may compare the read data with the test vector using a bit-to-bit comparison method, and the data discrepancy checker 530 may transmit an information signal including the comparison result to the memory controller 550.

The ECC controller 540 may include an ECC encoder 541 performing an ECC encoding operation and an ECC decoder 542 performing an ECC decoding operation. The ECC encoder 541 may perform an ECC encoding operation of data, which are outputted from a host through the memory controller 550, to generate encoded data. The encoded data may be written into the memory device 510 through the memory controller 550. The ECC decoder 542 may perform an ECC decoding operation of data, which are outputted from the memory device 510 through the memory controller 550, to generate decoded data. The decoded data may be transmitted to the host through the memory controller 550. The ECC encoding operation performed by the ECC encoder 541 and the ECC decoding operation performed by the ECC decoder 542 may be performed according to an ECC level provided by the memory controller 550.

The memory controller 550 may control operations of the test vector generator 520, the data discrepancy checker 530 and the ECC controller 540. The memory controller 550 may write data outputted from the host through a host interface into the memory device 510 or may transmit data outputted from the memory device 510 to the host. During a write operation, the memory controller 550 may transmit data outputted from the host to the ECC controller 540 so that the ECC controller 540 performs an ECC encoding operation of the data to generate encoded data and may receive the encoded data from the ECC controller 540 to write the encoded data into the memory device 510. During a read operation, the memory controller 550 may transmit data outputted from the memory device 510 to the ECC controller 540 so that the ECC controller 540 performs an ECC decoding operation for correcting errors of the data to generate decoded data and may receive the decoded data from the ECC controller 540 to transmit the decoded data to the host.

The memory controller 550 may set and provide an ECC level which is used in an ECC encoding operation and an ECC decoding operation that are performed by the ECC controller 540. That is, the ECC controller 540 may perform an ECC encoding operation and an ECC decoding operation according to any one level of a plurality of ECC levels (e.g., first to $N^{th}$ ECC levels ECC LEVEL-1, ECC LEVEL-2, . . . , and ECC LEVEL-N). Thus, the memory controller 550 may include an ECC level storage unit 553 in which the first to $N^{th}$ ECC levels ECC LEVEL-1, ECC LEVEL-2, . . . , and ECC LEVEL-N are stored. In an embodiment, the first to $N^{th}$ ECC levels ECC LEVEL-1, ECC LEVEL-2, . . . , and ECC LEVEL-N may have different abilities of error correction. For example, the first ECC level ECC LEVEL-1 may have an ability for correcting an error of a single bit, and the $N^{th}$ ECC level ECC LEVEL-N may have an ability for correcting errors of "N"-number of bits. The memory controller 550 may check and calculate an error rate of the memory device 510 to perform a control operation for setting an ECC level at an initialized step. The memory controller 550 may periodically check and calculate an error rate of the memory device 510 to perform a control operation for setting an ECC level at a non-initialized step. In addition, the memory controller 550 may perform a control operation for a data scrubbing process and may perform a control operation for changing an ECC level during the data scrubbing process.

The memory status checker 560 may receive information on a current status of the memory device 510 from the memory controller 550 and may store the information on the current status of the memory device 510 therein. In addition, the memory status checker 560 may periodically check an access status of the memory device 510 and may transmit the check result to the memory controller 550. Thus, in the event that the memory controller 550 controls the access to the memory device 510 or the initialization of the memory device 510, the memory controller 550 may transmit the information on the current status of the memory device 510 to the memory status checker 560.

An ECC level set process performed by the memory system 500 illustrated in FIG. 9 is, for the most part, the same as the ECC level set process described with reference to FIG. 2. According to an embodiment of FIG. 9, the memory controller 550 may calculate an error rate of the memory device 510 according to an information signal outputted from the data discrepancy checker 530 and may select an ECC level corresponding to the error rate of the memory device 510 among the first to $N^{th}$ ECC levels ECC LEVEL-1, ECC LEVEL-2, . . . , and ECC LEVEL-N. The selected ECC level may be transmitted to the ECC controller 540. The ECC controller 540 may perform an ECC encoding operation and an ECC decoding operation using the ECC level outputted from the memory controller 550.

Figure 10:
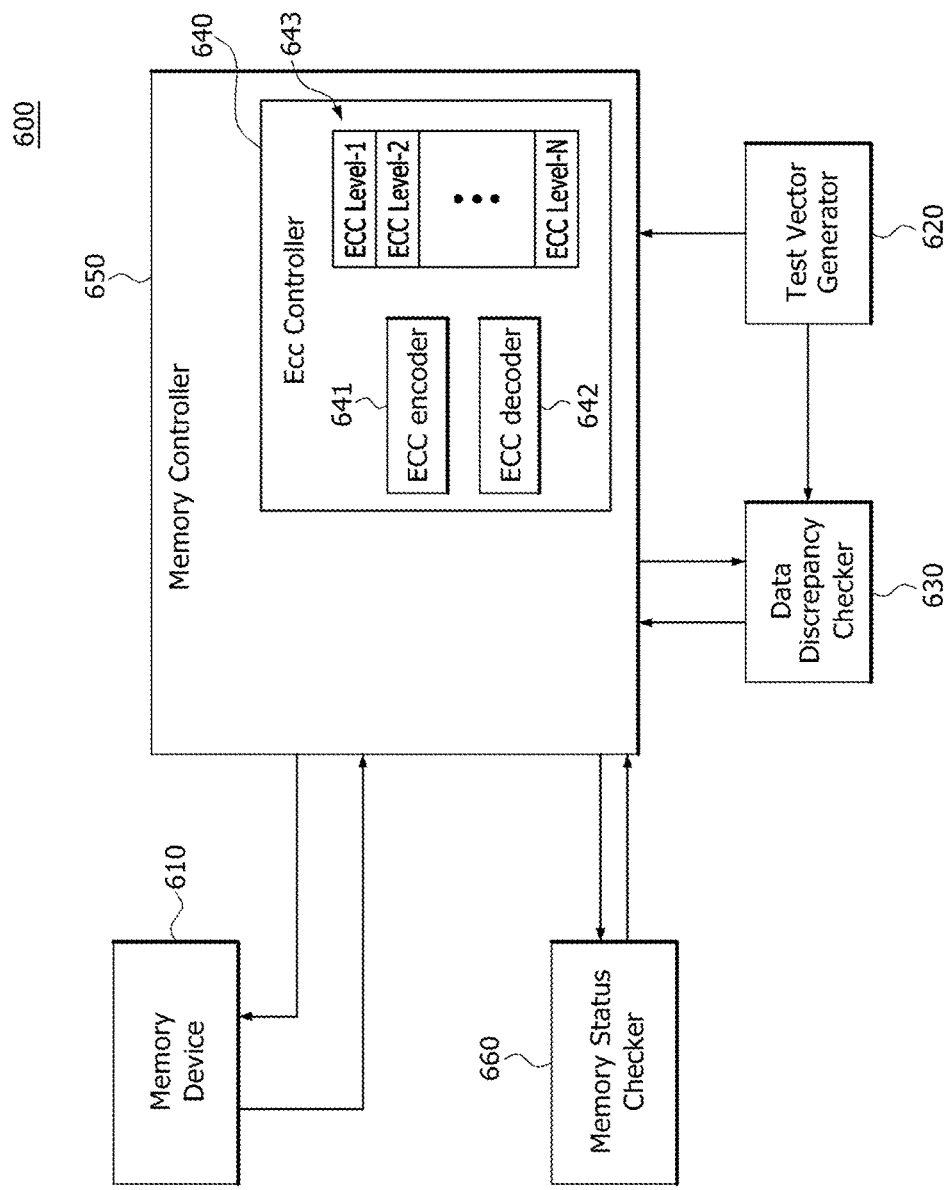
FIG. 10 is a block diagram illustrating a memory system according to an embodiment of the present disclosure.

FIG. 10 is a block diagram illustrating a memory system 600 according to an embodiment of the present disclosure. Referring to FIG. 10, the memory system 600 may include a memory device 610, a test vector generator 620, a data discrepancy checker 630 and a memory controller 650. The memory system 600 may further include a memory status checker 660. The memory system 600 may have substantially the same configuration as the memory system 100 described with reference to FIG. 1 except that an ECC controller 640 is included in the memory controller 650. That is, the memory controller 650 of the memory system 600 may include the ECC controller 640. The ECC controller 640 may be configured to include an ECC encoder 641, an ECC decoder 642 and an ECC level storage unit 643. Although not illustrated in the drawings, the ECC level storage unit 643 may be disposed in another component other than the ECC controller 640. The memory system 600 may perform substantially the same operation as the memory system 100 described with reference to FIG. 1 except that an operation of the ECC controller 640 is performed in the memory controller 650.

Figure 11:
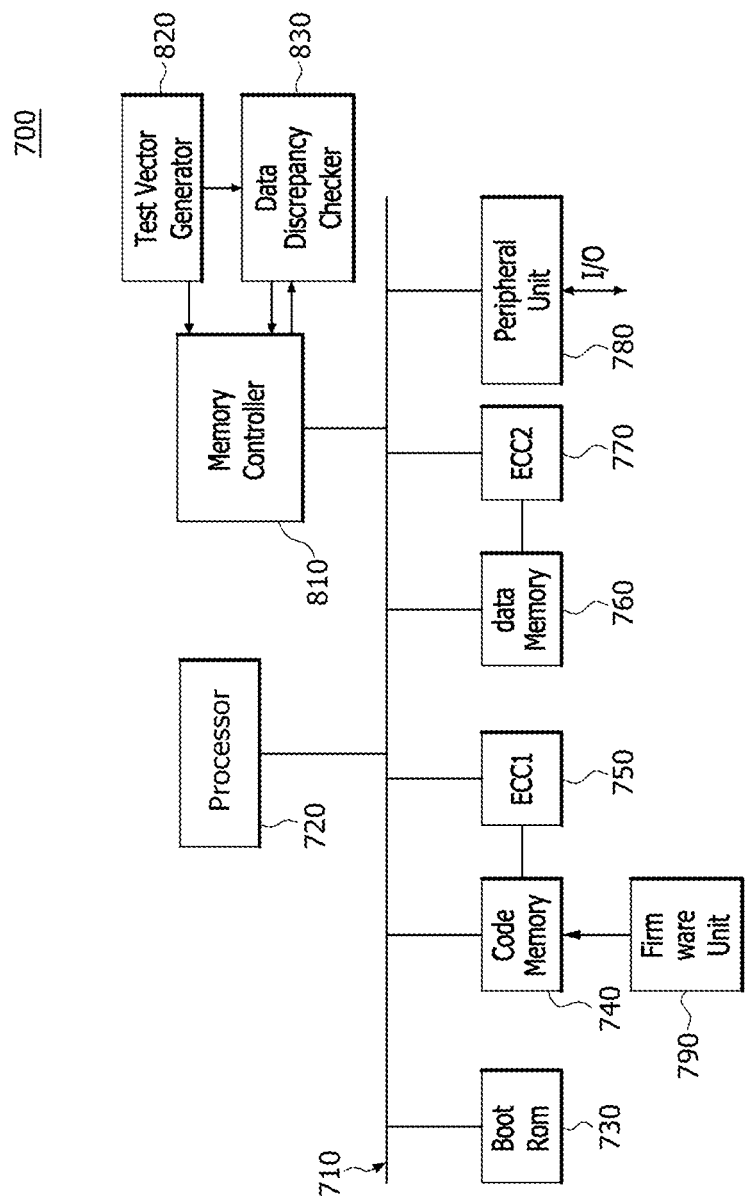
FIG. 11 is a block diagram illustrating an electronic system according to an embodiment of the present disclosure.

FIG. 11 is a block diagram illustrating an electronic system 700 according to an embodiment of the present disclosure. Referring to FIG. 11, the electronic system 700 may be configured to include a bus 710, a processor 720, a boot ROM 730, a code memory 740, a first error correction unit (ECC1) 750, a data memory 760, a second error correction unit (ECC2) 770, a peripheral unit 780, a firmware unit 790, a memory controller 810, a test vector generator 820 and a data discrepancy checker 830.

The components of the electronic system 700 may be coupled with one another through the bus 710 providing a path through which data or signals are transmitted. The processor 720 may include one or more processors, for example, multi-core processors, microprocessors, application specific integrated circuits (ASICs), field programmable gate arrays (FPGAs), a central processing unit (CPU), a graphic processing unit (GPU), or other processors executing commands. The boot ROM 730 may include a ROM device, which is capable of storing information and/or commands necessary for a booting process, or another static storage device. The code memory 740 may be a nonvolatile memory device that stores firmware codes. The first error correction unit (ECC1) 750 may perform an error correction operation while firmware codes in the code memory 740 are updated. The data memory 760 may be a dynamic memory device or a nonvolatile memory device. The second error correction unit (ECC2) 770 may perform an error correction operation while data are transmitted to the data memory 760. The peripheral unit 780 may interface with an external device through an input/output (I/O) unit. The firmware unit 790 may store firmware of the electronic system 700.

The memory controller 810, the test vector generator 820 and the data discrepancy checker 830 may have the same or substantially the same configurations as the memory controller 150, the test vector generator 120 and the data discrepancy checker 130 of the memory system 100 described with reference to FIG. 1, respectively. After the electronic system 700 is booted using codes stored in the boot ROM 730, error rates of the code memory 740 and the data memory 760 may be calculated using test vectors generated by the test vector generator 820. The calculated error rates may be outputted from the electronic system 700 through the peripheral unit 780. The memory controller 810 may be any one of the memory controller 150 illustrated in FIG. 1, the memory controller 550 illustrated in FIG. 9 and the memory controller 650 illustrated in FIG. 10. The memory controller 810 may determine an ECC level corresponding to the error rates of the code memory 740 and the data memory 760 using the data discrepancy checker 830. If the ECC level is determined, the memory controller 810 may control the first error correction unit (ECC1) 750 to perform an ECC encoding operation of the firmware according to the determined ECC level and to generate encoded firmware. In addition, the memory controller 810 may write the encoded firmware into the code memory 740. The encoded firmware may include an ECC level flag. After the system is reset, an ECC decoding operation of the firmware stored in the code memory 740 may be performed and the system may normally operate. The ECC encoding operation and the ECC decoding operation performed according to the determined ECC level may be equally applicable to a write operation for writing data into the data memory 760 and a read operation for reading out data stored in the data memory 760.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A memory system comprising:
   a test vector generator configured to generate a test vector to be written into a memory device;
   a data discrepancy checker configured to compare read data outputted from the memory device with the test vector to generate an information signal corresponding to a comparison between the read data and the test vector;
   an error correction code (ECC) controller configured to perform an ECC encoding operation and an ECC decoding operation according to any one among a plurality of ECC levels based on a control signal; and
   a memory controller configured to control the test vector generator, the data discrepancy checker and the ECC controller,
   wherein the memory controller transmits the control signal corresponding to an error rate of the memory device to the ECC controller, based on the information signal generated by the data discrepancy checker.

2. The memory system of claim 1, further comprising a memory status checker configured to receive a status of the memory device from the memory controller to store the status of the memory device therein.

3. The memory system of claim 1, wherein the ECC controller includes:
   an ECC encoder configured to perform an ECC encoding operation;
   an ECC decoder configured to perform an ECC decoding operation; and
   an ECC level storage unit configured to store the plurality of ECC levels.

4. The memory system of claim 3, wherein the ECC encoder performs an ECC encoding operation of original data to generate a codeword including the original data, a parity and an ECC level flag.

5. The memory system of claim 4, wherein the ECC decoder applies an ECC level according to the ECC level flag to the codeword to perform an ECC decoding operation.

6. The memory system of claim 1, wherein the plurality of ECC levels have different abilities of error correction.

7. The memory system of claim 1, wherein the memory controller is configured to write the test vector into the memory device and configured to transmit read data corresponding to the test vector outputted from the memory device to the data discrepancy checker.

8. The memory system of claim 7, wherein the memory controller transmits a command for test request to the test vector generator if the memory device is in an initialized status.

9. The memory system of claim 1, wherein the memory controller writes the test vector into a target region of the memory device and transmits the read data corresponding to the test vector stored in the memory device to the data discrepancy checker, if the access number of times of the target region is greater than a predetermined value.

10. The memory system of claim 1,
    wherein the memory controller reads out all of data in the memory device so that ECC decoding operations of the respective read data are performed using ECC levels applied to the respective read data to generate decoded data;
    wherein all of the decoded data are encoded using an ECC encoding operation with a currently set ECC level; and
    wherein the memory controller performs a data scrubbing process that writes the encoded data into the memory device.

11. The memory system of claim 10, wherein the data scrubbing process is performed if the access to the memory device is not requested during a certain time period.

12. A memory system comprising:
    a test vector generator configured to generate a test vector to be written into a memory device;
    a data discrepancy checker configured to compare read data outputted from the memory device with the test vector to generate an information signal corresponding to a comparison between the read data and the test vector;
    an error correction code (ECC) controller configured to perform an ECC encoding operation and an ECC decoding operation using an ECC level inputted to the ECC controller; and
    a memory controller configured to control the test vector generator, the data discrepancy checker and the ECC controller,
    wherein the memory controller transmits the ECC level corresponding to an error rate of the memory device among a plurality of ECC levels to the ECC controller, based on the information signal generated by the data discrepancy checker.

13. The memory system of claim 12, wherein the ECC controller includes:
    an ECC encoder configured to perform an ECC encoding operation; and
    an ECC decoder configured to perform an ECC decoding operation.

14. The memory system of claim 13, wherein the ECC encoder performs an ECC encoding operation of original data to generate a codeword including the original data, a parity and an ECC level flag.

15. The memory system of claim 14, wherein the ECC decoder applies an ECC level according to the ECC level flag to the codeword to perform an ECC decoding operation.

16. The memory system of claim 12, wherein the memory controller includes an ECC level storage unit configured to store the plurality of ECC levels.

17. The memory system of claim 16, wherein the plurality of ECC levels have different abilities of error correction.

18. A memory system comprising:
    a test vector generator configured to generate a test vector to be written into a memory device;
    a data discrepancy checker configured to compare read data outputted from the memory device with the test vector to generate an information signal corresponding to a comparison between the read data and the test vector; and a memory controller configured to control the test vector generator and the data discrepancy checker, wherein the memory controller performs an error correction code (ECC) encoding operation and an ECC decoding operation using an ECC level corresponding to an error rate of the memory device among a plurality of ECC levels, based on the information signal generated by the data discrepancy checker.

19. The memory system of claim 18, wherein the memory controller includes an ECC controller; and wherein the ECC controller includes:

an ECC encoder configured to perform an ECC encoding operation;

an ECC decoder configured to perform an ECC decoding operation; and an ECC level storage unit configured to store the plurality of ECC levels.

20. The memory system of claim 19, wherein the ECC encoder performs an ECC encoding operation of original data to generate a codeword including the original data, a parity and an ECC level flag.

21. The memory system of claim 20, wherein the ECC decoder applies an ECC level according to the ECC level flag to the codeword to perform an ECC decoding operation.

22. The memory system of claim 18, wherein the plurality of ECC levels have different abilities of error correction.

* * * * *